United States Patent
Lorca Hernando

(10) Patent No.: US 9,537,512 B2
(45) Date of Patent: Jan. 3, 2017

(54) METHOD AND A SYSTEM IMPLEMENTING A TURBO-DIVERSITY SCHEME FOR WIRELESS OFDM SYSTEMS

(71) Applicant: Telefonica, S.A., Madrid (ES)

(72) Inventor: Javier Lorca Hernando, Madrid (ES)

(73) Assignee: Telefonica, S.A., Madrid (ES)

( * ) Notice: Subject to any disclaimer, the term of this patent is extended or adjusted under 35 U.S.C. 154(b) by 0 days.

(21) Appl. No.: 14/415,259

(22) PCT Filed: Jul. 16, 2013

(86) PCT No.: PCT/EP2013/064993
§ 371 (c)(1),
(2) Date: Jan. 16, 2015

(87) PCT Pub. No.: WO2014/012925
PCT Pub. Date: Jan. 23, 2014

(65) Prior Publication Data
US 2015/0188573 A1    Jul. 2, 2015

(30) Foreign Application Priority Data

Jul. 18, 2012   (ES) .................................. 201231125

(51) Int. Cl.
*H04L 5/00*      (2006.01)
*H04L 1/06*      (2006.01)
(Continued)

(52) U.S. Cl.
CPC ....... *H03M 13/2771* (2013.01); *H03M 13/258* (2013.01); *H03M 13/2792* (2013.01);
(Continued)

(58) Field of Classification Search
CPC .... H04L 1/0066; H04L 1/0625; H04L 1/0618; H04L 1/065; H03M 13/258; H03M 13/6513
(Continued)

(56) References Cited

U.S. PATENT DOCUMENTS 7,154,936 B2 * 12/2006 Bjerke .................. H04L 1/0003
375/148
7,180,967 B2 *  2/2007 Hoshino ............. H03M 13/258
375/264

(Continued)

FOREIGN PATENT DOCUMENTS

EP    1 172 959 A2    1/2002
EP    2 439 868 A1    4/2012

OTHER PUBLICATIONS

International Search Report for PCT/EP2013/064993 dated Nov. 7, 2013.
(Continued)

*Primary Examiner* — James C Kerveros
(74) *Attorney, Agent, or Firm* — Sughrue Mion, PLLC

(57) ABSTRACT

The method comprising passing, a base station or a user terminal, information comprising data signals and encoding, a first and a second turbo encoders, said received data signals, generating two different turbo code blocks comprising a set of systematic and parity bits. Where, in order to enhance detection the two different turbo code blocks are simultaneously transmitted through a wireless OFDM system and wherein the data signals to be encoded by said second turbo encoder are interleaved prior encoding by an external bit interleaver.
The system of the invention is arranged to implement the method of the invention.

7 Claims, 14 Drawing Sheets

(51) Int. Cl.
  *H04L 1/00* (2006.01)
  *H04B 7/02* (2006.01)
  *H03M 13/27* (2006.01)
  *H03M 13/25* (2006.01)

(52) U.S. Cl.
  CPC .............. *H04B 7/02* (2013.01); *H04L 1/0066* (2013.01); *H04L 1/0071* (2013.01); *H04L 1/065* (2013.01); *H04L 1/0631* (2013.01); *H04L 1/0668* (2013.01); *H04L 5/0007* (2013.01); *H04L 1/0606* (2013.01); *H04L 5/001* (2013.01)

(58) Field of Classification Search
  USPC ......................................................... 714/776
  See application file for complete search history.

(56) References Cited

U.S. PATENT DOCUMENTS

| | | | | |
|---|---|---|---|---|
| 7,436,895 B1* | 10/2008 | Tujkovic | .................. | H04L 1/005 375/267 |
| 7,778,197 B2* | 8/2010 | Kim | ...................... | H04L 1/0625 370/252 |
| 7,882,413 B2* | 2/2011 | Chen | .................... | H04B 7/0669 714/751 |
| 8,819,529 B2* | 8/2014 | Tan | .................... | H04B 7/15592 714/786 |
| 2004/0131041 A1* | 7/2004 | Tirkkonen | ............ | H04L 1/0625 370/349 |
| 2006/0156207 A1* | 7/2006 | Vithanage | ......... | H03M 13/3905 714/792 |
| 2006/0159195 A1* | 7/2006 | Ionescu | ................. | H04L 1/0041 375/267 |
| 2009/0313528 A1* | 12/2009 | Chugg | ................... | H04B 7/026 714/758 |
| 2010/0077275 A1* | 3/2010 | Yu | ........................ | H03M 13/114 714/752 |
| 2012/0014475 A1 | 1/2012 | Wu | | |

OTHER PUBLICATIONS

Written Opinion for PCT/EP2013/064993 dated Nov. 7, 2013.
International Preliminary Report on Patentability for PCT/EP2013/064993 dated Jul. 17, 2014.

* cited by examiner

METHOD AND A SYSTEM IMPLEMENTING A TURBO-DIVERSITY SCHEME FOR WIRELESS OFDM SYSTEMS

CROSS REFERENCE TO RELATED APPLICATIONS

This application is a National Stage of International Application No. PCT/EP2013/064993 filed Jul. 16, 2013, claiming priority based on Spanish Patent Application No. P201231125 filed Jul. 18, 2012, the contents of all of which are incorporated herein by reference in their entirety.

FIELD OF THE ART

The present invention is related, in general, to wireless communications, and more specifically, generally relates, in a first aspect, to a method for implementing a turbo-diversity scheme for wireless OFDM systems.

A second aspect of the invention relates to a system arranged to implement the method of the first aspect.

PRIOR STATE OF THE ART

Wireless communications are heavily affected by multiple harmful sources of interference, in addition to the usual background noise which is present in every communication system. The presence of multiple obstacles between the transmitter and the receiver causes a number of reflection, scattering and diffraction phenomena which results in multiple copies of the original signal arriving at the receiver, commonly referred to as multipath [7]. Destructive interference between the received signals results in deep nulls at the receiver, which must be properly overcome in order to recover the information.

Multipath is mostly encountered in dense urban scenarios of present mobile communication systems such as GSM, UMTS, WiMAX or LTE, where there is usually non-line-of-sight (NLOS) conditions between the base station and the user terminal. In addition, mobility of both the user's terminal and the objects in the environment introduces additional Doppler spreading, which causes time variations of the deep fades according to the user's speed [7]. Moreover, interference from neighbour cells (especially at the cell edges) reduces the received signal-to-interference-plus-noise ratio (SINR) yet worsening the effects of multipath.

There exist several techniques to overcome the effects of multipath, including among others: channel coding, interleaving, scrambling, and diversity. While the first three techniques have been thoroughly studied and implemented in all practical mobile communication systems, diversity techniques offer multiple flavours which can be exploited in an innovative way.

One of the techniques exploited in diversity is multi-antenna technology, which is incorporated as a baseline in both LTE and LTE-Advanced. Receive diversity relies on the presence of several receive antennas at the terminal, which capture different versions of the same signal thus aiding in the reception through maximum ratio combining (MRC) [2]. Transmit diversity is usually based on the Alamouti scheme, which is a widespread orthogonal space-time block coding technique (STBC) that enhances reception with minimal receiver complexity [2]. OFDM technologies (such as WiMAX, LTE and LTE-Advanced) employ a variant of the Alamouti scheme called SFBC (space-frequency block coding) in which the signals are coded across space and frequency, instead of space and time. Other transmits diversity schemes rely upon adaptive precoding of the original signals based on quality reports sent from the users (as is the case for LTE Transmission Mode 6 [2]).

Problems with Existing Solutions

Alamouti coding is a simple yet effective way of enhancing detection, with the desirable property of being the only orthogonal space-time code with unitary rate [4]. Orthogonality implies no interference between the signals of both antennas, which simplifies detection to a great extent. FIG. 1 shows the basics of Alamouti coding.

Independently, channel coding protects the information using one of several possible coding techniques, among which turbo coding and convolutional coding are the most widely used [2]. These techniques protect the information through addition of redundancy bits (called parity bits) which are efficiently generated at transmission by a combination of shift registers and, in the case of turbo coding, interleave operations. FIG. 2 graphically depicts the rate-⅓ turbo coding operation as employed in UMTS and LTE.

The drawback of this scheme is that transmit diversity is completely decoupled from channel coding, thus precluding any decoding interaction between them at the receiver. SFBC introduces redundancy at the second antenna by replicating the original signal (previously conjugated and sign-reversed so as to achieve orthogonality), but does not exploit any property of the channel coded signal which increase redundancy.

There exist situations where traditional diversity schemes combined with channel coding do not alleviate interference, as happens e.g. in the context of heterogeneous networks. Deployment of small cells in the coverage zone of a macro cell is usually biased so as to increase the coverage zone of the small cell, giving rise to so-called Cell Range Expansion (CRE) [5]. The CRE zone of the small zone is characterized by very low geometry values (less than 0 dB), where macro interference is usually much higher than the desired signal, as depicted in FIG. 3. In these conditions, receivers require advanced structures to overcome interference and avoid radio link failures.

Therefore, in both homogeneous and heterogeneous scenarios there is still the need for enhanced reception at the cell boundaries and in severe interference conditions. The lack of a "soft handover" in OFDM systems, as the one contemplated in WCDMA, demand other complex cooperative mechanisms between cells aimed at enhancing the received SINR, as in CoMP (Cooperative Multi-Point). CoMP operation is still very complex and requires tight interaction between cells as well as a detailed knowledge of the received channel state information (CSI) at each of the different transmitters.

It is important to note that a "soft handover" mechanism similar to the one present in WCDMA cannot be applied as such in OFDM systems, because the terminal would not be able to discriminate the transmissions from different base stations. Given two base stations synchronized in time from which the same information t is sent towards a mobile user, the received signal would be:

$$r = h^{(1)}t + h^{(2)}t + n = (h^{(1)} + h^{(2)})t + n,$$

where $h^{(1)}$ and $h^{(2)}$ represent the relevant channel transfer functions at the frequencies of interest between the user and the two base stations, respectively, and n is the interference plus noise component. As the terminal cannot distinguish the signals from the two stations (because no code multiplexing exists as in CDMA), coherent detection is not possible and the combined transmission will be seen as an equivalent SISO channel with a combined transfer function equal to the sum of the individual transfer functions. This results in no advantage for the terminal, except for an additional 3 dB gain in the average received signal (which might be better obtained with the use of receive diversity), with the additional drawback of introducing artificial signal nulls at the frequencies where the two channel frequency responses cancel each other.

To overcome these difficulties, advanced interference cancellation receivers are being studied for coverage extension. One of the most attractive solutions is referred to as SIC receivers [6]. They involve an iterative detection-reconstruction-subtraction scheme in which interference is successively cancelled out from the received signal, improving detection especially at very low SINR conditions.

Other solutions have also been proposed. In [8] a turbo coded diversity transceiver is described, where turbo encoding is combined with antenna diversity and a SIC-like procedure is also introduced. The drawback of this scheme is that only one encoded version of the block is transmitted (no additional redundancy is introduced) and the procedure only tries to exploit successive interference cancellation at the output of a conventional turbo decoder. In [9] a turbo space-time code is proposed comprising two systematic STC modules operating at symbol level, thus extending Trellis Coded Modulation (TCM) to more than one antenna. This scheme spreads the turbo operation principle across the antenna domain, but does not exploit the possibility of combined turbo-SIC decoding which would alleviate multi-antenna interference; moreover, each constituent encoder is based on a convolutional encoder which is far from the Shannon limit. Other similar works can also be found in the literature [10] [11].

Therefore, more effective diversity schemes are necessary in order to enhance detection in both homogeneous and heterogeneous scenarios.

SUMMARY OF THE INVENTION

The present invention introduces an alternative to the state of the art by providing a novel diversity scheme for wireless OFDM communication systems in which the same information block gives rise to two different turbo encoded blocks, where systematic and parity bits of both received blocks interact together in the decoding process.

The aim of the present invention is to enhance detection in those wireless communication systems.

To that end, the invention in a first aspect is a method for implementing a turbo-diversity scheme in wireless OFDM systems, according to conventional techniques, comprising:

passing, a base station or a user terminal, information comprising data signals; and encoding, a first and a second turbo encoders, said received data signals, and generating two different turbo code blocks comprising a set of systematic and parity bits.

On contrary to the known proposals, in the present invention in order to enhance detection said two different turbo code blocks are simultaneously transmitted through a wireless OFDM system, and wherein the data signals to be encoded by said second turbo encoder are interleaved prior encoding by an external bit interleaver.

In an embodiment, the invention comprises transmitting each of said two different turbo code blocks over different antennas. In this case, the systematic bits after the second turbo encoder are further de-interleaved, and Alamouti-based space-frequency block coding is applied to those systematic bits prior to transmitting them to a second antenna of said two different antennas.

In another embodiment, the invention comprises each of said two different turbo code blocks on different component carriers in a carrier aggregation-capable wireless system.

Furthermore, said two different turbo code blocks generated are further processed according to any of a rate matching technique, scrambling, interleaving, modulation mapping among other technologies.

Other embodiments of the method of the first aspect of the present invention are described according to appended claims 2 to 13, and in a subsequent section related to the detailed description of several embodiments.

In a second aspect, the present invention also provides a system for turbo-diversity in wireless OFDM systems, according to conventional techniques, comprising:

two base stations and at least a user terminal transmitting and receiving data signals through a wireless OFDM system; and a first and a second turbo encoders (102 and 103) adapted to encode said data signals received and to generate two different turbo code blocks comprising a set of systematic and parity bits, each said turbo coded block being transmitted by a different base station.

The system of the present invention, on contrary to the known proposals, further comprises an external interleaver unit (101) arranged to said second (103) turbo encoder adapted for interleaving the data signals prior being encoded by the second turbo encoder, and in order to enhance detection simultaneously transmits each of said turbo code blocks by each of said base stations through a wireless OFDM system.

The system also comprises a plurality of processing units arranged to said first and second turbo encoders and in an embodiment a space-frequency block coding (104), SFBC.

BRIEF DESCRIPTION OF THE DRAWINGS

The previous and other advantages and features will be more fully understood from the following detailed description of embodiments, with reference to the attached figures, which must be considered in an illustrative and non-limiting manner, in which.

DETAILED DESCRIPTION OF SEVERAL EMBODIMENTS

The present invention provides a novel diversity scheme for OFDM wireless systems, such as LTE and LTE-Advanced, but not precluding other wireless technologies like Wi-Fi or WiMAX. The invention described aims at enhancing cell-edge reception through the introduction of a novel diversity scheme with two variants: one making use of an additional transmit antenna, and another one employing Carrier Aggregation.

The proposed diversity scheme extends the concept of turbo coding through a combined turbo-diversity scheme in which two different turbo code blocks derived from the same original information block are simultaneously transmitted. The two code blocks are obtained by passing the information source through two turbo encoders, each comprising different constituent convolutional encoders and/or internal interleavers [3]. The two code blocks thus obtained are simultaneously transmitted by considering one of the following two alternatives:

1. Each code block is transmitted over different TX antennas, giving rise to an enhanced turbo-diversity scheme based on multiple antennas.

2. Each code block is transmitted on a different Component Carrier (CC) when the system supports Carrier Aggregation (CA), giving rise to an enhanced turbo-diversity scheme based on Carrier Aggregation.

Figure 1:
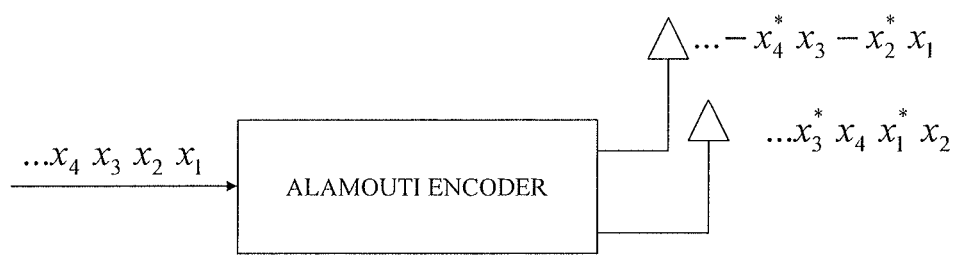
FIG. 1 shows the basics of Alamouti coding.
Figure 2:
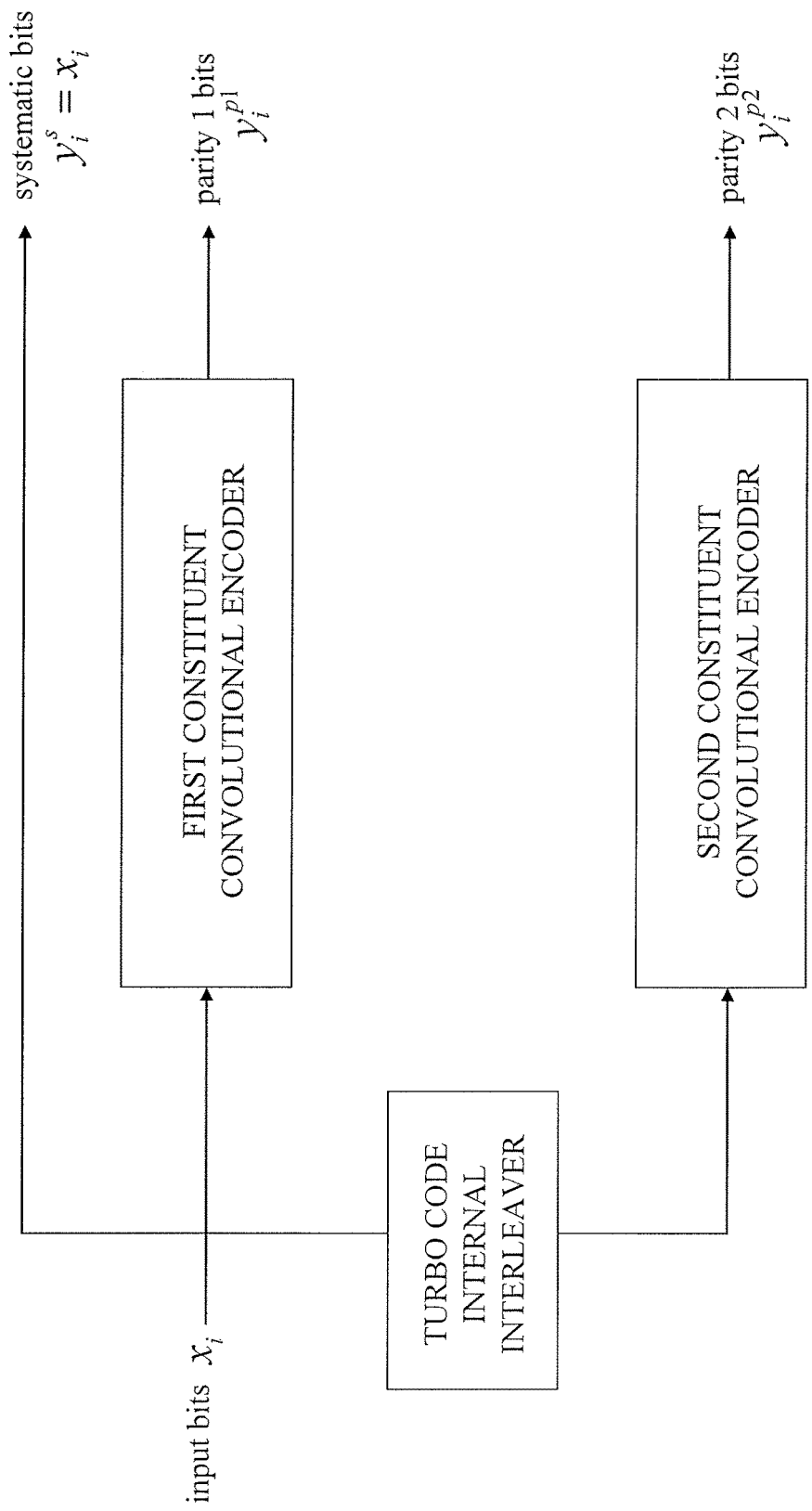
FIG. 2 graphically depicts the rate-⅓ turbo coding operation as employed in UMTS and LTE.
Figure 3:
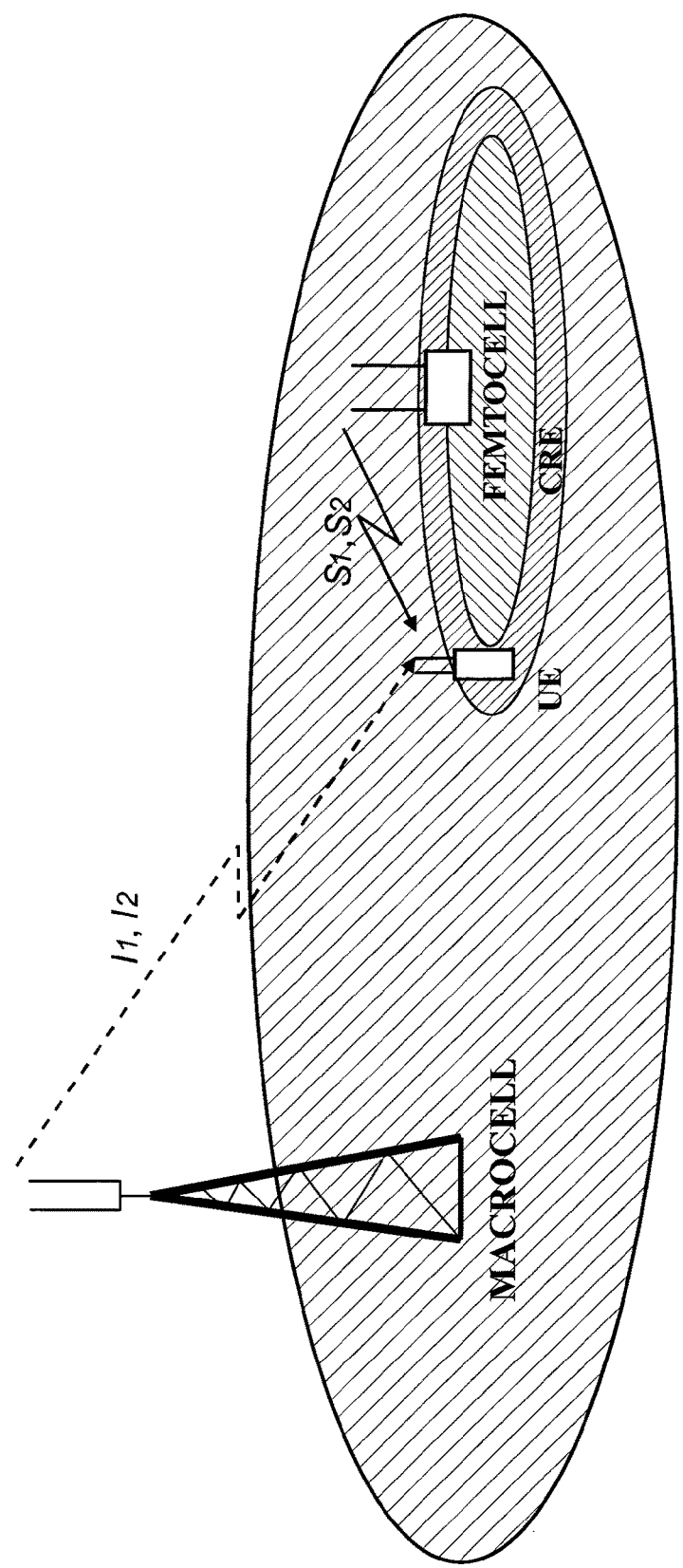
FIG. 3 shows the CRE zone of a small cell, where it can be seen that macro interference is much higher than the desired signal.
Figure 4:
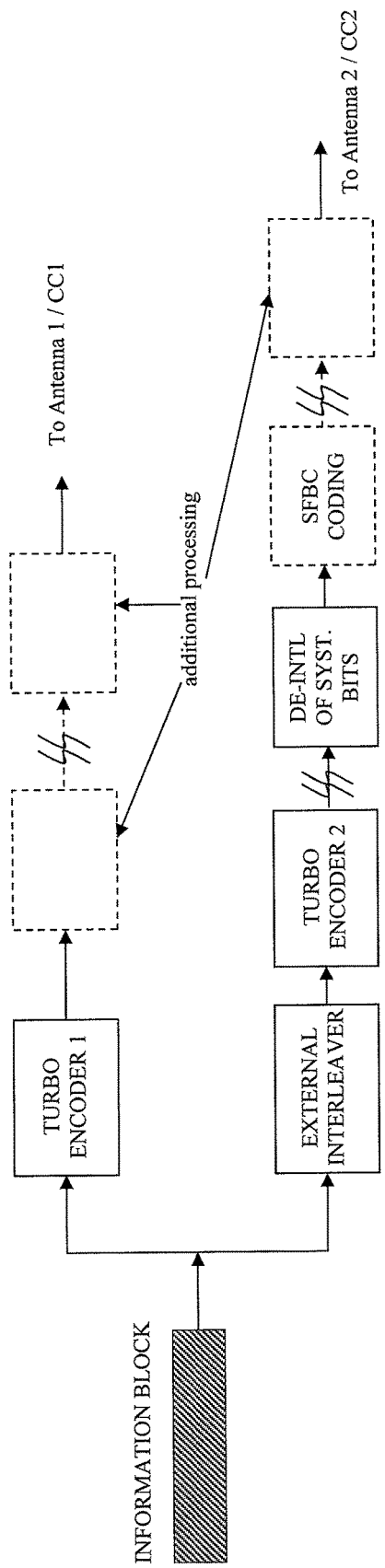
FIG. 4 shows schematically the described invention at the transmit side, according to an embodiment.

FIG. 4 describes schematically the proposed invention at the transmit side.

Application of the two turbo coding stages gives rise to two code blocks comprising a set of systematic bits and parity bits, where systematic bits constitute a replica of the original bits and are thus common for both code blocks. The second turbo encoder is preceded by an external bit interleaver, different to the internal interleavers which characterize turbo encoders 1 and 2. In the first alternative, additional SFBC coding of the symbols carrying systematic bits shall be added prior to transmission, as will be explained in section 3. The final processed blocks are transmitted by antennas 1 and 2, when considering alternative 1 (multi-antenna based transmit diversity), or by Component Carriers 1 and 2 when considering alternative 2 (Carrier Aggregation-based transmit diversity).

Additional processing blocks are marked in dashed lines according to the technology employed, such as (but not limited to) rate matching, scrambling, interleaving, modulation mapping, and so on.

The identity of the systematic bits in both turbo encoded blocks can be exploited in alternative 1 through specific SFBC coding of the corresponding complex modulated symbols, aimed at enhancing radio reception. Prior to this, the second set of systematic bits must be de-interleaved in order to use the same subcarrier frequencies for them in both antennas. Alternative 2 does not require SFBC coding, as no interference appears between the encoded blocks; MRC coherent detection can thus be performed for the symbols carrying systematic bits. The symbols carrying parity bits are however different in both alternatives.

Figure 5:
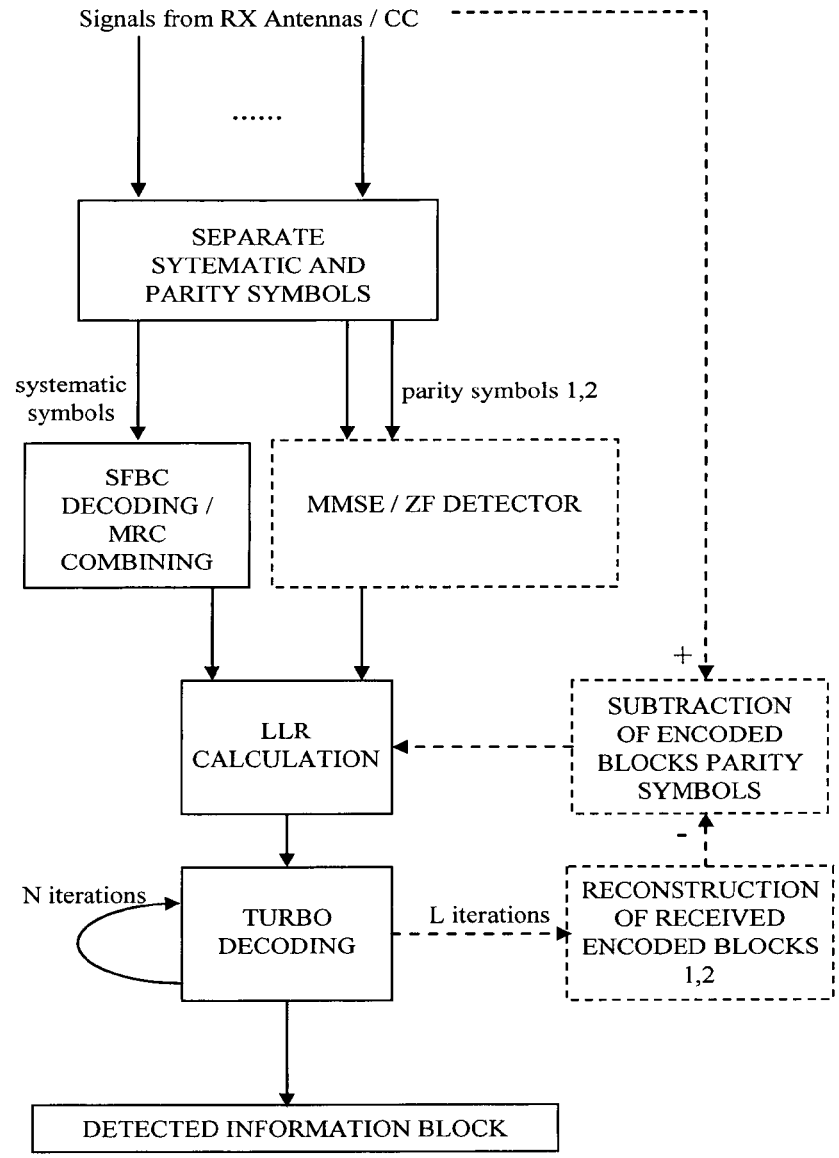
FIG. 5 shows schematically the basic block diagram of the described invention at the reception side, according to an embodiment.

Upon reception, a novel turbo-SIC detection mechanism is proposed that exploits the soft information coming from the two code blocks, combining turbo detection, Alamouti decoding and SIC techniques. The proposed block diagram is different depending on the alternative considered. FIG. 5 represents the basic block diagram at reception.

After separation of the symbols carrying systematic and parity bits (denoted in what follows as systematic and parity symbols, respectively), systematic symbols demand different processing techniques depending on the alternative considered. Alternative 1 requires SFBC decoding, while alternative 2 demands MRC combining of the symbols coming from each Component Carrier.

Parity symbols also require initial MIMO decoding in alternative 1 in order to separate both transmissions, where interference between antennas must be overcome through Zero Forcing (ZF) or MMSE equalization. This block is marked in dashed lines to indicate that it only applies in alternative 1; in alternative 2 it is not needed as no interference exists between the parity symbols. After calculation of the Log-Likehood Ratio values (LLR), a turbo decoding stage iteratively combines the LLRs coming from each antenna or Component Carrier, performing mutual exchange of extrinsic information between the two internal turbo decoders for an enhanced combined detection. The effectiveness of the extrinsic information exchange is enhanced by the external interleaver, which causes LLR values to be uncorrelated for both turbo decoders.

An interference-cancellation decoding technique is then proposed for alternative 1, with the aid of two blocks marked in dashed lines in FIG. 5: reconstruction of the received encoded blocks, and subtraction of parity symbols from the received signals. These blocks try to subtract inter-stream interference after reconstruction of the original encoded blocks, hence introducing a SIC-like decoding procedure. Subtraction of interference allows for better LLR calculation and subsequent turbo decoding, and by repeating the procedure it is possible to successively enhance detection with any desired accuracy.

For alternative 2, a combined turbo decoding procedure is proposed in which both encoded blocks interact together by taking advantage of mutual extrinsic information. In this case the decoding procedure is simpler as no interference exists between the received encoded blocks; hence no inter-stream interference cancellation is necessary.

After a number N of turbo iterations (and number L of reconstruction iterations for alternative 1), the process stops.

In what follows the two alternatives are presented in detail.

Alternative 1: Turbo-Diversity Based on Multiple Antennas:

This alternative extends the concept of Alamouti-based transmit diversity in OFDM wireless communication systems. Given that the transmitter has two antennas, the present invention proposes to employ the second TX antenna to send a different encoded version of the original information, obtained by passing it through an external interleaver followed by another turbo encoder, while at the same time performing Alamouti-based SFBC coding for the symbols carrying only systematic bits.

The rationale for having two different coded versions of the same information block is the enhancement of the turbo decoding process that can be achieved by exchanging extrinsic information between the two stages in an iterative way. The external interleaver ensures low correlation between the LLR values successively obtained by each decoder.

Figure 6:
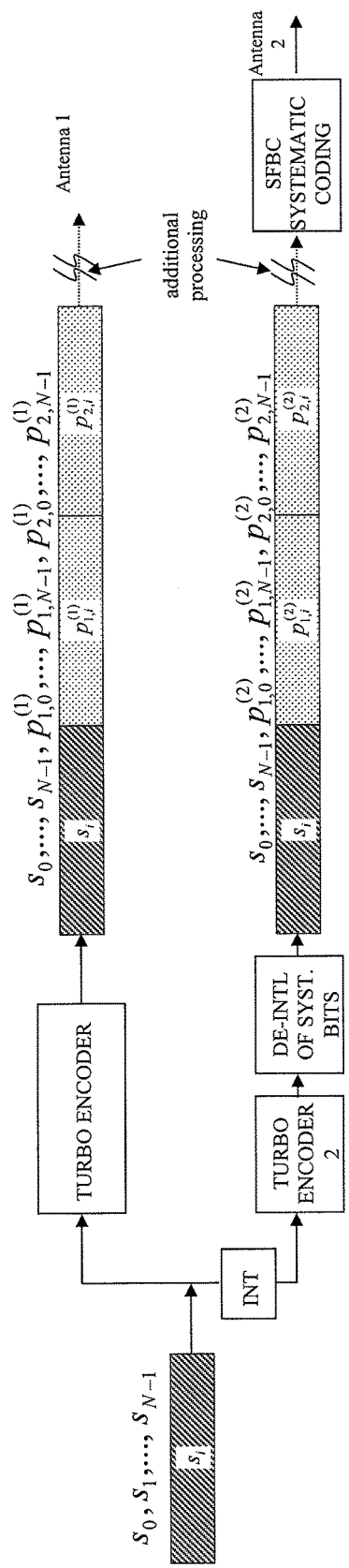
FIG. 6 represents the basic encoding procedure, according to an embodiment.

In an embodiment, a turbo-diversity encoding scheme for the multiple antenna case is proposed. FIG. 6 depicts the basic encoding procedure as proposed in the present invention. The figure assumes rate-⅓ turbo encoders, but any other coding rate is equally valid for the purpose of the present invention.

The N information bits $s_0, \ldots, s_{N-1}$ enter simultaneously encoder 1 and encoder 2, each encoder being characterized by different constituent convolutional encoders and (possibly) internal interleavers. The second encoder is preceded by an external bit interleaver, which in general will be different than the internal interleavers used in the turbo encoders. The output of each encoder comprises three sets of bits, namely systematic, parity 1 and parity 2 bits (for rates other than ⅓ there may be more or less output parity bits). Systematic bits are a replica of the original input bits ($s_0, \ldots, s_{N-1}$), while parity bits represent the additional redundancy aimed at protecting the information from channel impairments. In the figure, parity 1 bits are denoted as $p_{1,0}^{(1)}, \ldots, p_{1,N-1}^{(1)}$ for the first encoder and $p_{1,0}^{(2)}, \ldots, p_{1,N-1}^{(2)}$ for the second encoder.

Parity 2 bits are denoted as $p_{1,0}^{(1)}, \ldots, p_{1,N-1}^{(1)}$ and $p_{1,0}^{(2)}, \ldots, p_{1,N-1}^{(2)}$ for the first and second encoder, respectively. All the systematic and parity bits have the same number N of bits as the original information block. Termination bits are added at the end of each encoded block in order to enforce the constituent encoders to zero state, as usually required in the standards [3].

The interleaver before the second turbo encoder interleaves the original bits prior to encoding. This interleaver is very important for the performance of the system. The size of the interleaver and its degree of "randomness" determines the overall performance by spreading burst of errors that could affect both antennas [12]. After the second turbo encoder, systematic bits are de-interleaved in order to apply subsequent SFBC coding of the systematic bits, as explained below.

It is noted that additional processing should always take place after the turbo encoders, and this is sketched in FIG. 6 prior to antenna transmission. In particular, a suitable constellation mapping function transforming bits into constellation symbols must exist, employing any of the usual modulation formats (BPSK, QPSK, 16QAM, etc.).

After the second turbo encoder, and prior to transmission by antenna 2, an additional SFBC coding stage transforms the complex modulated symbols carrying systematic bits by applying standard Alamouti-based SFBC coding over consecutive pairs of symbols ($t_1, t_2$) [2].

$$X = \begin{pmatrix} x_1(2i) & x_2(2i) \\ x_1(2i+1) & x_2(2i+1) \end{pmatrix} = \begin{pmatrix} t_1(i) & t_2(i) \\ -t_2^*(i) & t_1^*(i) \end{pmatrix},$$

where $x_1(2i), x_2(2i)$ denote the symbols at subcarrier $2i$ transmitted by the two antennas, and $x_1(2i+1), x_2(2i+1)$ denote the corresponding symbols at subcarrier $2i+1$. Hence each pair of consecutive symbols $t_1(i), t_2(i)$ gives rise to four complex transmitted symbols distributed over two antennas and two subcarriers. SFBC requires the symbols to be consecutive in frequency, so as to consider the same channel coefficients in the decoding of each pair $x_j(2i), x_j(2i+1)$. Hence systematic bits are de-interleaved prior transmission in order to maintain the original subcarrier frequencies.

It is noted that the first row is identical to the original pair of symbols, but the second antenna involves conjugation and sign inversion and constitutes an orthogonal code that achieves optimal detection with a linear receiver [4].

A situation may appear where a complex symbol carries a mix of systematic and parity bits. This happens e.g. when the length of the original block is not an integer multiple of the modulation order (e.g. 2, 4 or 6 for QPSK, 16QAM or 64QAM, respectively). In that case such symbol will be considered as a "parity" symbol as some of its constituent bits are parity bits.

SFBC coding improves detection of the symbols containing systematic bits. However SFBC coding is not applied over the parity bits, as they are different for the two turbo encoders; additional processing is required in order to recover them and take advantage of the two-antenna transmission.

Figure 7:
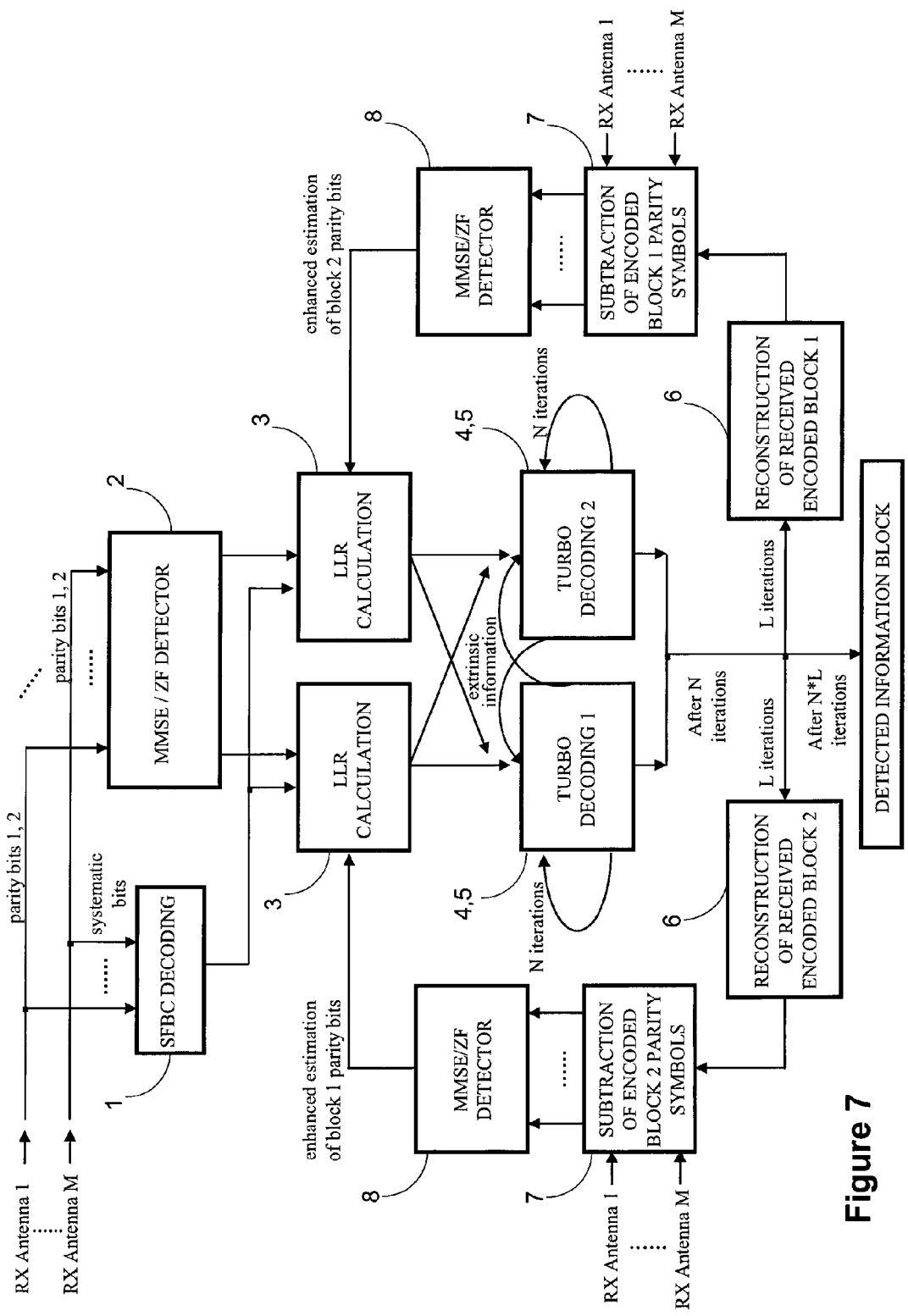
FIG. 7 is the proposed turbo-SIC decoding technique for the multiple antenna case, according to an embodiment.

In a second embodiment, it is proposed a turbo-SIC decoding technique for the multiple antenna case. Interference between the symbols carrying parity bits can be conveniently exploited in an iterative way, in which soft output information from one of the decoders represents an extrinsic information for the other (and vice versa). The flowchart depicted in FIG. 7 represents the proposed iterative procedure.

Assuming that the mobile terminal has $M \geq 2$ RX antennas, the received baseband signal components $r_1, \ldots, r_M$ coming from each receive antenna take the form:

$$r_1 = h_{11}t_1 + h_{12}t_2 + n_1$$
$$r_2 = h_{21}t_1 + h_{22}t_2 + n_2$$
$$\vdots$$
$$r_M = h_{M1}t_1 + h_{M2}t_2 + n_M$$

$t_1$ and $t_2$ denote the transmitted code blocks from each of the two transmit antennas, $n_1 \ldots n_M$ are complex Gaussian noise terms, and $h_{ij}$ denote the components of the $M \times 2$ channel transfer matrix H given by:

$$H = \begin{pmatrix} h_{11} & h_{12} \\ h_{21} & h_{22} \\ \vdots & \vdots \\ h_{M1} & h_{M2} \end{pmatrix}.$$

This channel matrix can be properly estimated by the receiver with the aid of pilot subcarriers or preambles, as e.g. in LTE where downlink and uplink channel matrix estimation makes use of Cell Reference Signals (CRS) and Sounding Reference Signals (SRS), respectively.

The proposed decoding process involves a number of iterative steps, marked with numbers in FIG. 7 and explained below:

Step 1: no interference exists between the symbols carrying only systematic bits thanks to the orthogonality property of SFBC coding:

$$XX^H = (|t_1|^2 + |t_2|^2) \cdot I.$$

I is the identity matrix, hence not appearing inter-antenna interference. It is thus possible to apply standard SFBC ML detection to obtain the i pairs of estimated symbols $\hat{t}_1(i), \hat{t}_2(i)$:

$$\hat{t}_1(i) = \frac{\sum_{j=1}^{M}(h_{j1}^* r_j(2i) + h_{j2} r_j^*(2i+1))}{\sum_{j=1}^{M}(|h_{j1}|^2 + |h_{j2}|^2)}$$

$$\hat{t}_2(i) = \frac{\sum_{j=1}^{M}(-h_{j2} r_j^*(2i) + h_{j1}^* r_j(2i+1))}{\sum_{j=1}^{M}(|h_{j1}|^2 + |h_{j2}|^2)}$$

If a symbol carries a mix of systematic and parity bits it is not feasible to perform SFBC decoding, hence it will be treated as a "parity only" symbol as explained in step 2.

Step 2: regarding the symbols carrying parity bits, interference between both antennas will appear unless additional processing is applied at the receiver side. In order to separate the two flows and take advantage of increased redundancy, it is possible to apply MIMO detection schemes to separate the symbols carrying parity bits from each antenna. Zero-forcing (ZF) and MMSE techniques are suitable for proper separation of the streams, with detection matrices W given respectively by:

$$W_{ZF} = (H^H H)^{-1} \cdot H^H,$$

$$W_{MMSE} = (H^H H + \sigma^2 I)^{-1} \cdot H^H$$

where $\sigma^2$ denotes the variance of the additive received Gaussian noise (which must be previously estimated), I the 2×2 identity matrix and $H^H$ the hermitian conjugate of matrix H.

Estimation of the original signals is thus obtained by the following matrix operation:

$$\begin{pmatrix} \hat{t}_1 \\ \hat{t}_2 \end{pmatrix} = W \cdot \begin{pmatrix} r_1 \\ r_2 \\ \vdots \\ r_M \end{pmatrix}.$$

This is the usual operation carried out in spatial multiplexing, where more than one stream are simultaneously transmitted in order to multiply the channel capacity. However in this case the goal is to increase protection against channel impairments, not capacity.

The two estimated symbols will suffer from inter-stream interference, especially if the SNR is low and/or the channel transfer matrix is ill-conditioned. Moreover, stream errors are in general highly correlated, which means that errors in one stream affect the other and vice versa. However, reliability of the estimated symbols can be enhanced with the following processing steps.

Step 3: once initial estimates of the original complex symbols $\hat{t}_1, \hat{t}_2$ have been obtained, it is possible to calculate the Log-Likelihood-Ratio (LLR) of each constituent bit $b_l$ for the whole set of symbols carrying systematic and parity bits:

$$LLR(b_l) = \ln \frac{\sum_{t \in S_l^+} f(\hat{t}|t)}{\sum_{t \in S_l^-} f(\hat{t}|t)} \approx \ln \frac{\max_{t \in S_l^+} f(\hat{t}|t)}{\max_{t \in S_l^-} f(\hat{t}|t)}.$$

Here $S_l^+, S_l^-$ denote the set of constellation symbols whose lth bit is 1 and 0, respectively, and f is the conditional probability density function (pdf) of $\hat{t}$ given that symbol t was transmitted. The approximation in the right-hand side corresponds to the case of high SNR, and is usually employed in order to reduce computation time especially in high order modulations.

Assuming the presence of Gaussian noise with variance $\sigma^2$, the conditional pdf takes the form:

$$f(\hat{t}|t) = \frac{1}{\sqrt{2\pi}\,\sigma} \exp\left(-\frac{|\hat{t} - t|^2}{2\sigma^2}\right).$$

Each symbol gives rise to 2, 4 or 6 LLR values when the modulation employed is QPSK, 16QAM or 64QAM, respectively. These LLR values are inputs to the turbo decoder, after which estimates of the original bits are delivered. Two sets of LLR values exist (one for each decoder), namely $LLR^{(1)}$ and $LLR^{(2)}$, where the systematic part is common with the exception of the external interleaver that needs to be applied before the second one. Hence:

$$LLR^{(1)} = \{LLR_S, LLR_{P1}^{(1)}, LLR_{P2}^{(1)}\}$$

$$LLR^{(2)} = \{\text{Intl}\{LLR_S\}, LLR_{P1}^{(2)}, LLR_{P2}^{(2)}\},$$

where Intl{ } stands for the external interleaver operation.

Step 4: a single turbo decoding iteration can be performed on each of the two sets of LLR values, employing the corresponding decoders. The output from the first decoder can be written as:

$$LLR^{(1)} \xrightarrow{\text{1st iteration}} y^{(1)}[k] = y^s[k] + L_{12}^{(1)}[k] + c^{(1)} L_{21}^{(1)}[k],$$

where $y^s[k] = LLR_S$ are the LLR values of the systematic bits, $L_{12}^{(1)}$ and $L_{21}^{(1)}$ are the mutual information terms exchanged by the internal constituent decoders of decoder 1, and $c^{(1)}$ is the extrinsic scaling factor. The combined output, after being interleaved by the external bit interleaver, can be regarded as an a priori input for the second decoder and denoted as $L_e^{(1 \to 2)}$.

The second decoder also performs a single iteration, considering $L_e^{(1 \to 2)} = \text{Intl}\{y^{(1)}[k]\}$ the extrinsic interleaved input information coming from the first decoder, resulting in the following expression:

$$LLR^{(2)} \xrightarrow{\text{1st iteration}} y^{(2)}[k] =$$

$$\text{Intl}\{y^s[k]\} + L_{12}^{(2)}[k] + c^{(2)} L_{21}^{(2)}[k] + c^{(1 \to 2)} L_e^{(1 \to 2)},$$

where $L_{12}^{(2)}$ and $L_2^{(2)}$ are the mutual information terms exchanged by the internal constituent decoders of decoder 2, $c^{(2)}$ is the corresponding extrinsic scaling factor and $c^{(1 \to 2)}$ is the mutual scaling factor for extrinsic information exchange between decoder 1 and decoder 2. Note that the systematic bits are interleaved prior decoding, as stated by the term $\text{Intl}\{y^s[k]\}$. All scaling factors can be obtained by extensive simulations in order to find the values that achieve the best performance.

It is to note that the interleaver between both constituent decoders helps to spread the bursts of errors from one decoder when entering the other one as extrinsic information. The higher the interleaver size (and degree of randomness), the better the performance.

More reliable estimates of the original bits have thus been obtained through interaction of both decoders.

Step 5: a second iteration can be performed for the first decoder, taking the de-interleaved outputs from the first iteration of the second decoder as valuable extrinsic information $L_e^{(2 \to 1)} = \text{Intl}^{-1}\{y^{(2)}[k]\}$:

$$y^{(1)}[k] = y^s[k] + L_{12}^{(1)}[k] + c^{(1)} L_{21}^{(1)}[k] + c^{(2 \to 1)} L_e^{(2 \to 1)},$$

where $c^{(2 \to 1)}$ is the mutual scaling factor for extrinsic information exchange between decoder 2 and decoder 1. A second iteration can again be performed for the second decoder, taking the interleaved outputs from the second iteration of the first decoder as extrinsic information $L_e^{(1 \to 2)}$:

$$y^{(2)}[k] = \text{Intl}\{y^s[k]\} + L_{12}^{(2)}[k] + c^{(2)} L_{21}^{(2)}[k] + c^{(1 \to 2)} L_e^{(1 \to 2)}.$$

This procedure can be repeated a predefined number of iterations N. Alternatively, early termination condition can be computed after each iteration in order to save computational resources in high SNR conditions.

Step 6: after a number of turbo decoding iterations, estimates of the original transmitted bits are obtained. However inter-stream interference initially present in the received parity bits makes the detection highly unreliable in low SINR conditions, as ZF or MMSE decoding performs poorly in the presence of heavy noise. To overcome this, it is possible to reconstruct the signals transmitted from both antennas as in successive interference cancellation (SIC) architectures. Reconstruction of the transmitted signals allows for subsequent subtraction of the interfering terms, and hence enhanced detection.

The complete reconstruction process implies regeneration of the baseband signals present at the transmit antennas, and this comprises encoding, modulating and passing the signals through all the physical layer blocks at transmission, including the effect of the channel through the estimated channel matrix H.

Step 7: it is possible to subtract the corresponding interference term from the signals at each of the RX antennas. Considering only parity bits (as the systematic bits are by construction interference-free), the following sets of equations are thus obtained:

$$r_1^{(1)\prime} = r_1 - h_{12}\hat{t}_2 = h_{11}t_1 + n_1^{(1)\prime}$$

$$r_2^{(1)\prime} = r_2 - h_{22}\hat{t}_2 = h_{21}t_1 + n_2^{(1)\prime}$$

$$\vdots$$

$$r_M^{(1)\prime} = r_M - h_{M2}\hat{t}_2 = h_{M1}t_1 + n_M^{(1)\prime}$$

$$r_1^{(2)\prime} = r_1 - h_{11}\hat{t}_2 = h_{12}t_2 + n_1^{(2)\prime}$$

$$r_2^{(2)\prime} = r_2 - h_{21}\hat{t}_1 = h_{22}t_2 + n_2^{(2)\prime}$$

$$\vdots$$

$$r_M^{(2)\prime} = r_M - h_{M1}\hat{t}_1 = h_{M2}t_2 + n_M^{(2)\prime}$$

$r_j^{(1)\prime}, r_j^{(2)\prime}$ denote the signals corresponding to both coded blocks that come from antenna RX j after removal of interference, and $n_j^{(1)\prime}, n_j^{(2)\prime}$ are complex baseband noise terms.

Step 8: MMSE or Zero-forcing detection can be applied over the two branches described above, in order to obtain more reliable estimations of the transmitted parity bits (as in Step 2):

$$\begin{pmatrix} \hat{t}_1^{(1)\prime} \\ \hat{t}_2^{(1)\prime} \end{pmatrix} = W \cdot \begin{pmatrix} r_1^{(1)\prime} \\ r_2^{(1)\prime} \\ \vdots \\ r_M^{(1)\prime} \end{pmatrix}$$

$$\begin{pmatrix} \hat{t}_1^{(2)\prime} \\ \hat{t}_2^{(2)\prime} \end{pmatrix} = W \cdot \begin{pmatrix} r_1^{(2)\prime} \\ r_2^{(2)\prime} \\ \vdots \\ r_M^{(2)\prime} \end{pmatrix},$$

where W represents the appropriate detection matrix. Considering only the useful quantities $\hat{t}_1^{(1)\prime}$ and $\hat{t}_2^{(2)\prime}$ from the above equations, this enables subsequent calculation of fresh, more reliable LLR values which are again input to both turbo decoders. A number of turbo decoding iterations can be performed again by repeating steps 4 and 5, yielding new, more reliable estimated information bits. These again can be used for reconstruction of the signals at the antennas, successively enhancing detection by repeating the process explained in steps 4, 5 and 6.

After a given number of reconstruction and decoding cycles (L), the process stops and final estimates of the original bits are delivered.

Alternative 2: Turbo-Diversity Based on Carrier Aggregation:

Carrier Aggregation is a simple yet effective way of increasing diversity. In this alternative it is proposed that each of the turbo encoded blocks is carried over a different Component Carrier (CC), assuming that the system supports Carrier Aggregation (CA) as e.g. in LTE Release 10. The presence of different coded blocks at each Component Carrier (CC) allows a combined turbo decoding process with the absence of any inter-stream interference.

This alternative is especially suited for very low SINR conditions. The presence of an additional CC not only increases the effective SINR (with an average SINR increase equal to 3 dB), but also allows for enhanced detection through application of the following proposed decoding process.

Figure 8:
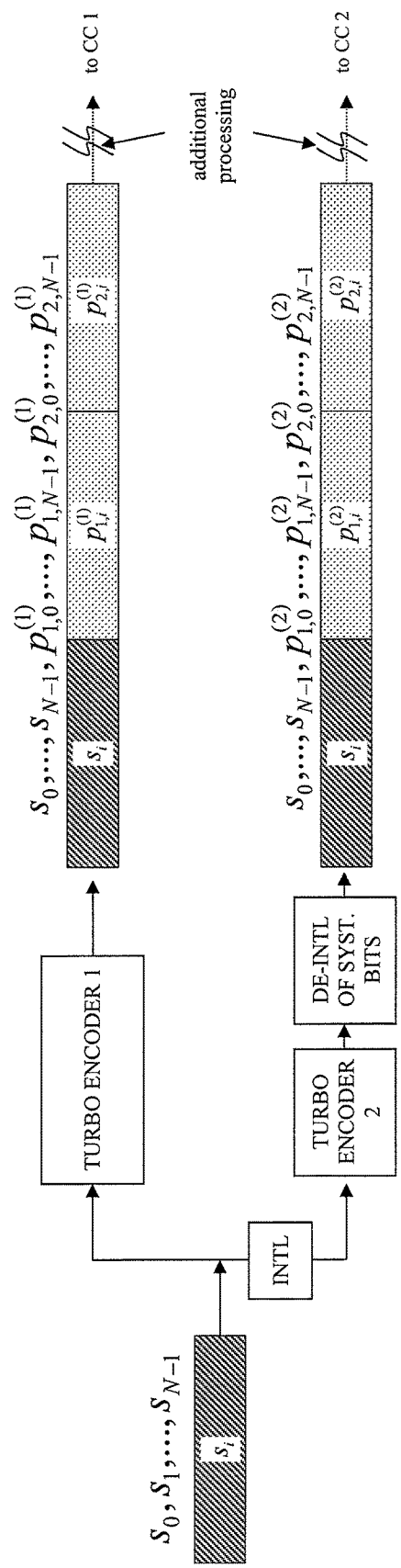
FIG. 8 is the proposed turbo-diversity encoding scheme based on carrier aggregation, according to an embodiment.

In an embodiment, the proposed turbo-diversity encoding scheme, as depicted in FIG. 8, based on Carrier Aggregation is as follows.

Turbo encoders 1 and 2 can be characterized by different constituent convolutional encoders and/or internal interleavers. The external interleaver prior to the second encoder ensures low correlation between the LLR values obtained by each decoder at reception. Systematic bits are de-interleaved after the second encoder, thus resulting in the same set of systematic bits for both component carriers.

The output from both turbo encoders is characterized by the same set of systematic bits, not suffering from inter-stream interference and therefore not requiring additional SFBC coding for the corresponding symbols, assuming that enough isolation exists between the centre frequencies of both component carriers at the transmitter's output. However the parity bits will remain different. In the figure it is depicted the case of a rate-⅓ turbo encoder, but any other coding rate is equally valid (giving rise to a possibly different number of parity bits).

The two encoded blocks shall pass the corresponding physical-layer processing blocks for each Component Carrier (as defined by the technology being considered) prior to transmission. Among others, a constellation mapping function will be in charge of mapping coded bits into complex modulated symbols.

A given complex modulated symbol may carry a mix of systematic and parity bits. However in this case it makes no difference as the symbols are now equally treated at transmission irrespective of the type of carried bits.

As no interference exists between the transmitted coded blocks (provided there is enough isolation between the CCs), reliability is improved compared to the multiple antenna case. This, however, comes at the cost of increasing the frequency resources dedicated to a single user. Terminals must also support Carrier Aggregation in order to simultaneously detect the two component carriers, thus requiring CA-capable RF front ends, filters and so on. While the aim of CA is to increase capacity by adding more frequency resources, the usage of CA in this invention is intended to increase diversity by duplicating the transmissions associated to a single user.

Contrary to other diversity schemes where simultaneous transmissions lead to coherent combination prior demodulation, it is proposed in this invention to combine the symbols carrying parity bits and perform also simultaneous turbo decoding of both streams, as explained in the following section.

In another embodiment a turbo decoding technique for the Carrier Aggregation case is proposed. In this case there is no need for the receiver to perform multi-antenna detection as the frequency resources are separated. Moreover, the transmitter may operate in SISO mode, although SFBC coding is not precluded; in that case conventional SFBC decoding and/or MRC processing would also be valid and would not change the described invention.

Figure 9:
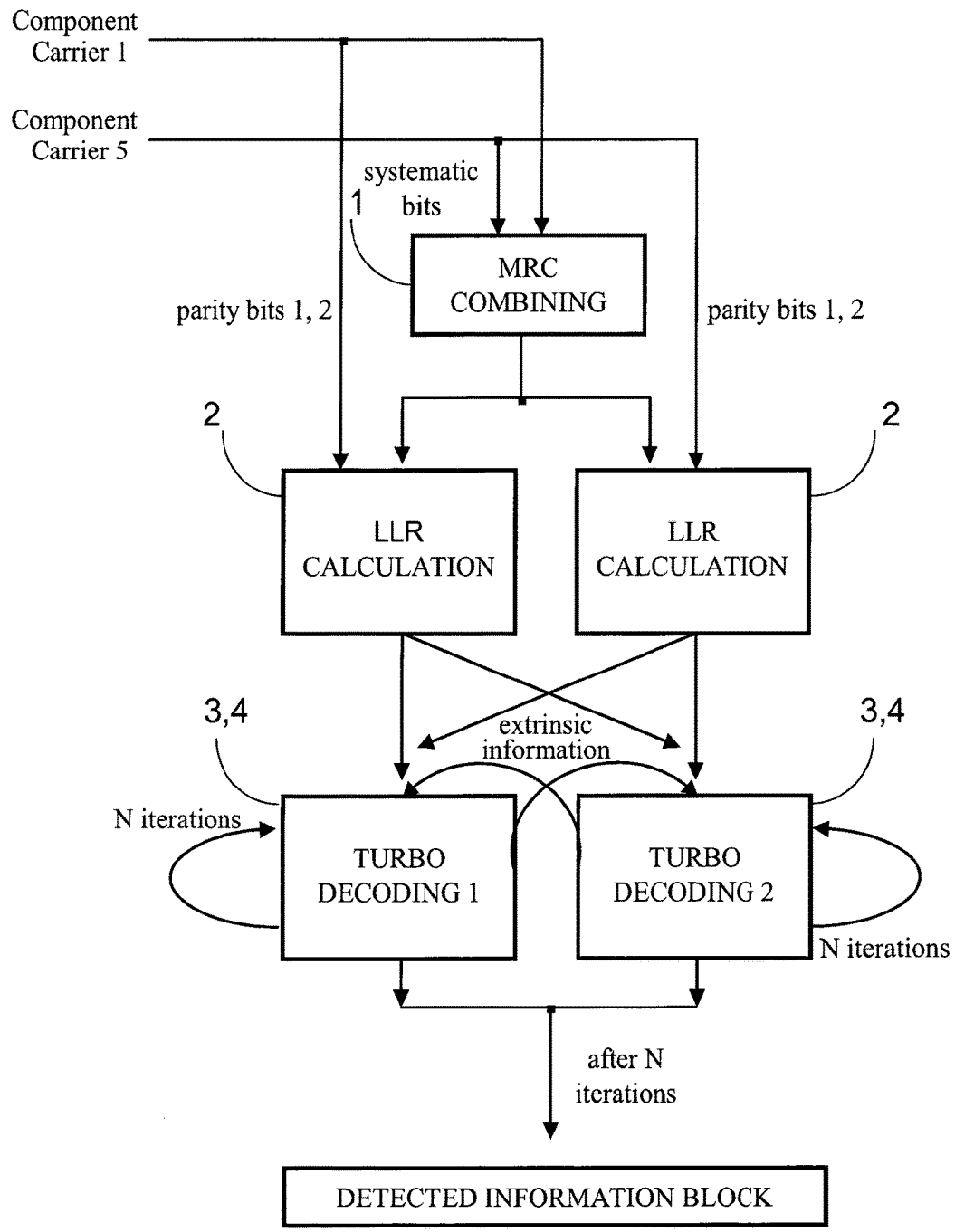
FIG. 9 is a flowchart of the proposed decoding technique for the carrier aggregation case, according to an embodiment.

FIG. 9 represents the flowchart of the proposed decoding technique for the Carrier Aggregation case.

Assuming simple SISO transmission, the received signals $r_{CC1}, r_{CC2}$ corresponding to each of the component carriers can be written:

$$r_{CC1} = h_{11,CC1} t_{CC1} + n_{CC1},$$

$$r_{CC2} = h_{11,CC2} t_{CC2} + n_{CC2}$$

where $h_{11,CC1}, h_{11,CC2}$ represent the channel transfer functions of the SISO channels for CC1 and CC2 respectively, $t_{CC1}, t_{CC2}$ are the transmitted symbols over CC1 and CC2, and $n_{CC1}, n_{CC2}$ are equivalent baseband noise components. Note that both baseband signals can be simultaneously received with the use of a single receive antenna as they are separated in frequency.

The proposed decoding process involves a number of iterative steps marked with numbers in FIG. 9 and explained below:

Step 1: as the systematic symbols of the received coded blocks are identical for both component carriers, it is possible to coherently combine them by applying Maximum Ratio Combining (MRC). Combination of the received systematic symbols yields:

$$r_{sys} = \frac{h_{11,CC1}^* r_{CC1} + h_{11,CC2}^* r_{CC2}}{|h_{11,CC1}|^2 + |h_{11,CC2}|^2}.$$

A situation may appear where a given complex symbol comprises a mix of systematic and parity bits. In this case the symbol shall be considered as a "parity only" symbol and appropriately processed as described below.

If the component carriers involve additional processing (such as independent de-scrambling or de-interleaving operations) it shall be performed prior to the combining operation.

Step 2: LLR calculation of all systematic and parity symbols can be performed as explained before:

$$LLR(b_l) = \ln \frac{\sum_{t \in S_l^+} f(\hat{t}|t)}{\sum_{t \in S_l^-} f(\hat{t}|t)} \approx \ln \frac{\max_{t \in S_l^+} f(\hat{t}|t)}{\max_{t \in S_l^-} f(\hat{t}|t)}.$$

LLR calculation will be performed for each component carrier, yielding two sets of values $LLR^{(1)}$ and $LLR^{(2)}$ where the systematic part is common to both of them with the exception of the external interleaver that needs to be applied before the second one. Hence:

$$LLR^{(1)} = \{LLR_S, LLR_{P1}^{(1)}, LLR_{P2}^{(1)}\}$$

$$LLR^{(2)} = \{Intl\{LLR_S\}, LLR_{P1}^{(2)}, LLR_{P2}^{(2)}\},$$

where Intl{ } stands for the external interleaver operation.

Step 3: a single turbo decoding iteration can be performed on each of the sets of LLR values. The output of the first turbo decoder can be written:

$$LLR^{(1)} \xrightarrow{1st\ iteration} y^{(1)}[k] = y^s[k] + L_{12}^{(1)}[k] + c^{(1)} L_{21}^{(1)}[k].$$

Similarly, the second decoder performs a single turbo decoding iteration taking the interleaved output from the first decoder as valuable extrinsic information, $L_e^{(1 \to 2)} = Intl\{y^{(1)}[k]\}$, yielding:

$$LLR^{(2)} \xrightarrow{1st\ iteration} y^{(2)}[k] =$$

$$Intl\{y^s[k]\} + L_{12}^{(2)}[k] + c^{(2)} L_{21}^{(2)}[k] + c^{(1 \to 2)} L_e^{(1 \to 2)}.$$

Step 4: a second iteration can be performed for the first decoder, taking the de-interleaved outputs from the first iteration of the second decoder as valuable extrinsic information $L_e^{(2 \to 1)} = Intl^{-1}\{y^{(2)}[k]\}$:

$$y^{(1)}[k] = y^s[k] + L_{12}^{(1)}[k] + c^{(1)} L_{21}^{(1)}[k] + c^{(2 \to 1)} L_e^{(2 \to 1)}.$$

Again a second iteration can be performed for the second decoder, taking the interleaved outputs from the second iteration of the first decoder as extrinsic information $L_e^{(1 \to 2)}$:

$$y^{(2)}[k] = Intl\{y^s[k]\} + L_{12}^{(2)}[k] + c^{(2)} L_{21}^{(2)}[k] + c^{(1 \to 2)} L_e^{(1 \to 2)}.$$

This procedure can be repeated a predefined number of iterations N. Alternatively, early termination condition can be computed at the end of each iteration in order to save computational resources in high SNR conditions.

After a number of turbo decoding iterations the process stops and estimates of the original transmitted bits are thus obtained. As no inter-stream interference was present in this case, it is not necessary to perform a recursive SIC procedure involving reconstruction and subsequent cancellation as in the multi-antenna case.

When the receiver employs more than one RX antenna the described procedure can be modified in a straightforward way as follows: given M receive antennas, the signals received for each component carrier are:

$$r_{1,CC1} = h_{11,CC1} t_{CC1} + n_{1,CC1}$$
$$r_{2,CC1} = h_{21,CC1} t_{CC1} + n_{2,CC1},$$
$$\ldots$$
$$r_{M,CC1} = h_{M1,CC1} t_{CC1} + n_{M,CC1}$$
$$r_{1,CC2} = h_{11,CC2} t_{CC2} + n_{1,CC2}$$
$$r_{2,CC2} = h_{21,CC2} t_{CC2} + n_{2,CC2}.$$
$$\ldots$$
$$r_{M,CC2} = h_{M1,CC2} t_{CC2} + n_{M,CC2}$$

MRC combining of the received signals gives:

$$r_{CC1} = \frac{h^*_{11,CC1} r_{1,CC1} + \ldots + h^*_{M1,CC1} r_{M,CC1}}{|h_{11,CC1}|^2 + \ldots + |h_{M1,CC1}|^2}$$

$$r_{CC2} = \frac{h^*_{11,CC2} r_{1,CC2} + \ldots + h^*_{M1,CC2} r_{M,CC2}}{|h_{11,CC2}|^2 + \ldots + |h_{M1,CC2}|^2}.$$

Steps 1 to 4 can then be performed as in the single-antenna case. Processing for the case of more than one TX antenna can also be extended in a straightforward way.

Figure 10:
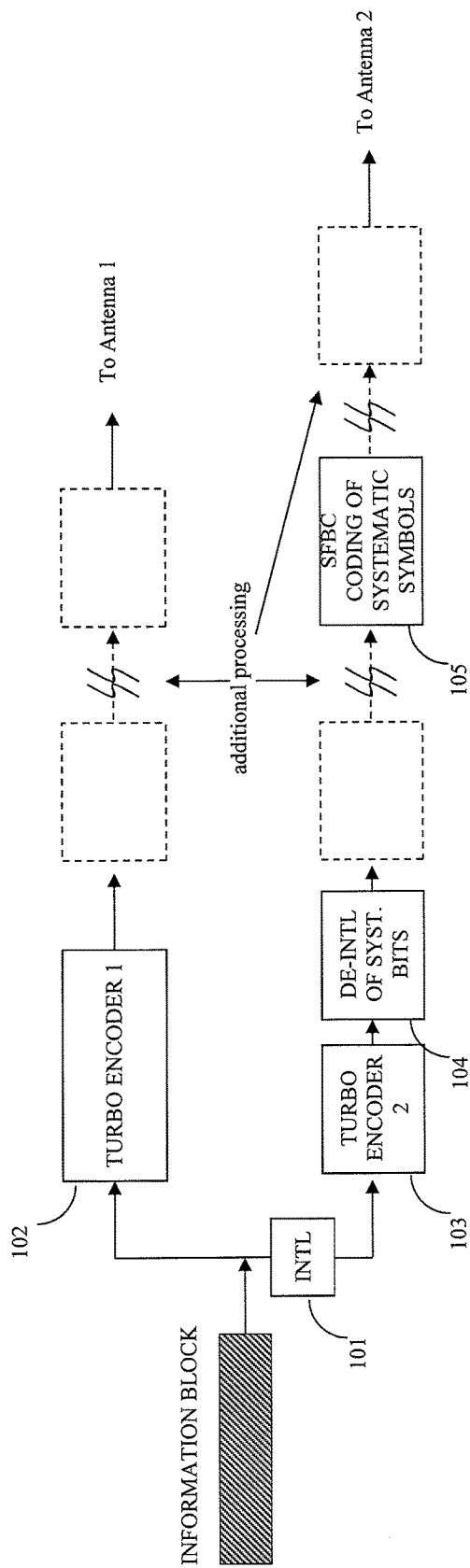
FIG. 10 illustrates an embodiment, in which a transmitter (Base Station or User Terminal) in an OFDM wireless communication system passes a given information block through two different turbo encoders (blocks 102 and 103).

FIG. 10 represents graphically an embodiment of the invention. A transmitter (Base Station or User Terminal) in an OFDM wireless communication system passes a given information block through two different turbo encoders (blocks 102 and 103). The turbo encoders may have different internal constituent convolutional encoders and/or internal interleavers. The second encoder is preceded by an external interleaver (block 101), and its output systematic bits are further de-interleaved (block 104). After the necessary additional processing blocks (which are marked in dotted lines and depend on the physical layer of the wireless system considered), the complex modulated symbols carrying only systematic bits are also SFBC-coded prior to antenna 2 (block 105).

Figure 11:
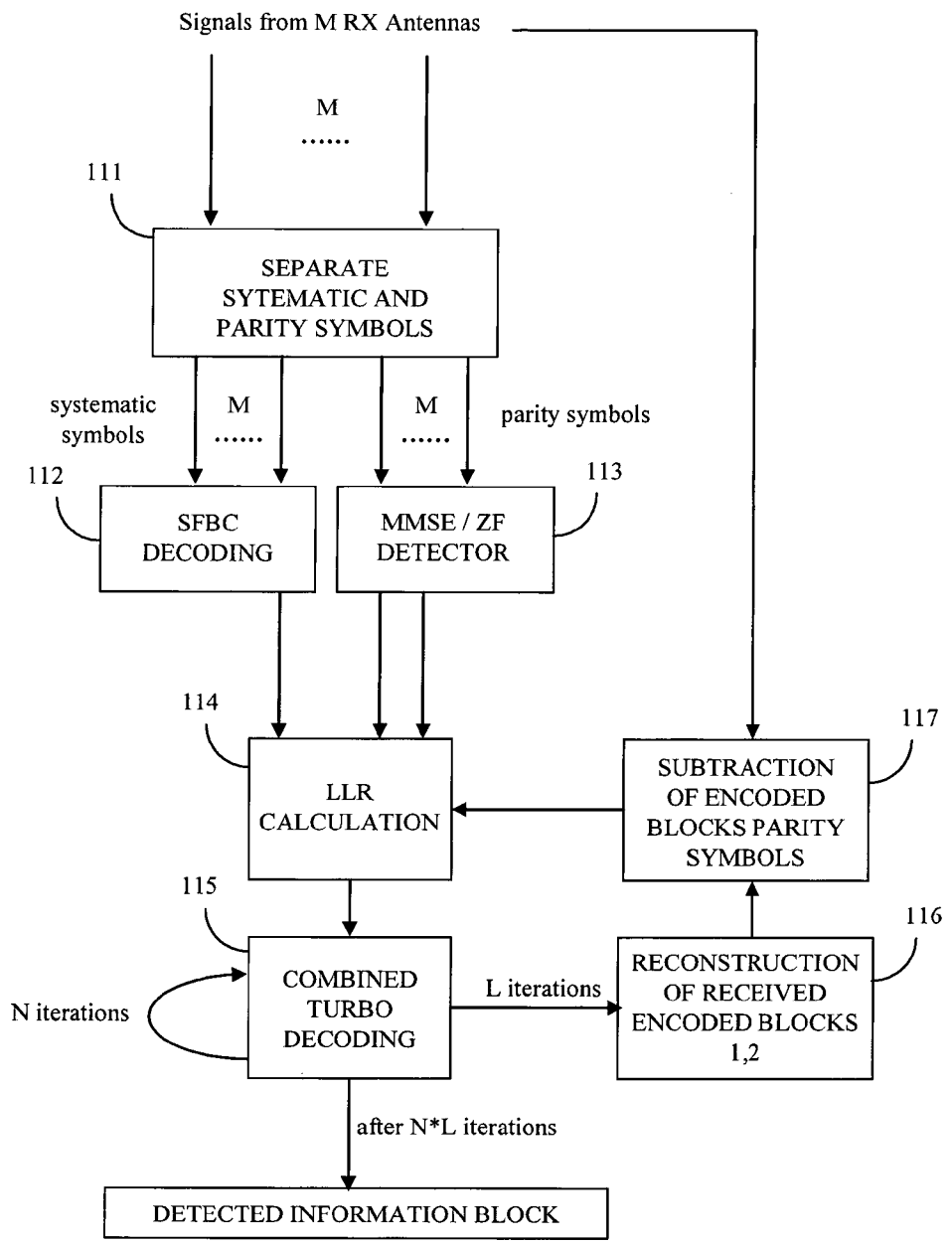
FIG. 11 illustrates the corresponding receiver of said figure.

The corresponding receiver for this case is depicted in FIG. 11. Block (111) separates the symbols carrying systematic and parity bits. Symbols carrying only systematic bits enter block (112) for subsequent SFBC decoding, while symbols carrying parity bits enter block (113) where ZF or MMSE detector partially removes inter-stream interference. Block (114) performs LLR calculation, and the LLR values obtained enter the combined turbo decoding block (115) comprising two cooperating turbo decoders. After a number N of iterations, an interference-cancellation stage involves reconstruction of the received encoded blocks (in block 116) and subtraction of interference from the other transmit antenna (in block 117). The complete interference cancellation scheme involves a number N*L of iterations, after which the detected information block can be delivered.

Figure 12:
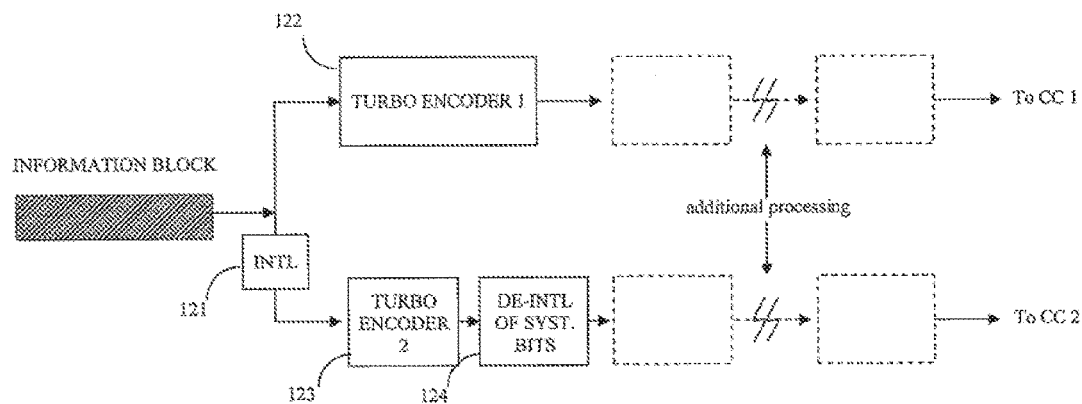
FIG. 12 illustrates another embodiment, in which the transmitter supports Carrier Aggregation and passes the information block through two different turbo encoders (blocks 122 and 123), the second one preceded by an external interleaver (block 121), resulting in two parallel independent transmissions over two different Component Carriers. The corresponding receiver for this case is shown in FIG. 13.

FIG. 12 depicts another embodiment of the invention, in which the transmitter supports Carrier Aggregation and passes the information block through two different turbo encoders (blocks 122 and 123), the second one preceded by an external interleaver (block 121), resulting in two parallel independent transmissions over two different Component Carriers. The output systematic bits from the second encoder are further de-interleaved (block 124). Only one antenna is needed in this case, although the presence of more TX antennas is not precluded. Additional processing blocks are also marked in dotted lines prior to transmission over two separate Component Carriers.

Figure 13:
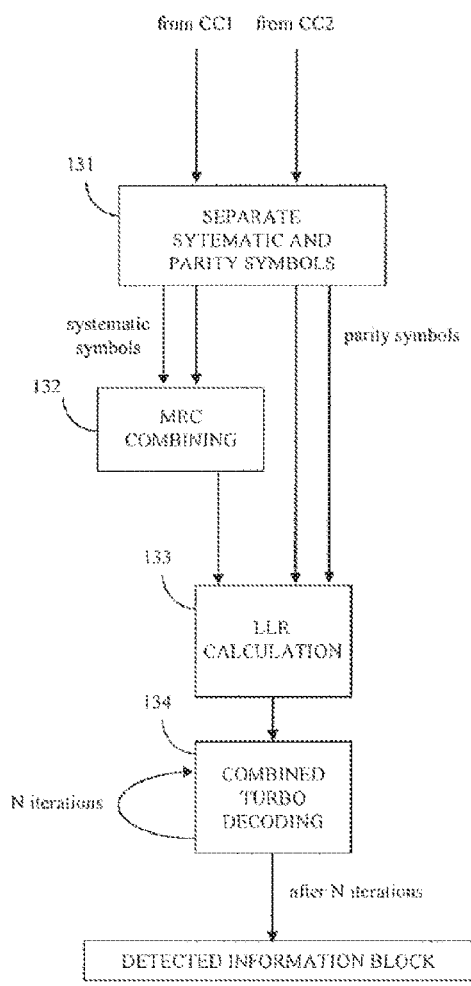

The corresponding receiver for this case is shown in FIG. 13. The two signals received from each Component Carrier enter block (131) which separates the symbols carrying systematic and parity bits. Block (132) performs MRC combining of the systematic symbols corresponding to both Component Carriers, which enter into block (133) along with the parity symbols. Block (133) performs LLR calculation, and block (134) is the combined turbo decoding stage comprising two cooperating turbo decoders. After a number N of iterations the process stops and the detected information block is delivered.

Figure 14:
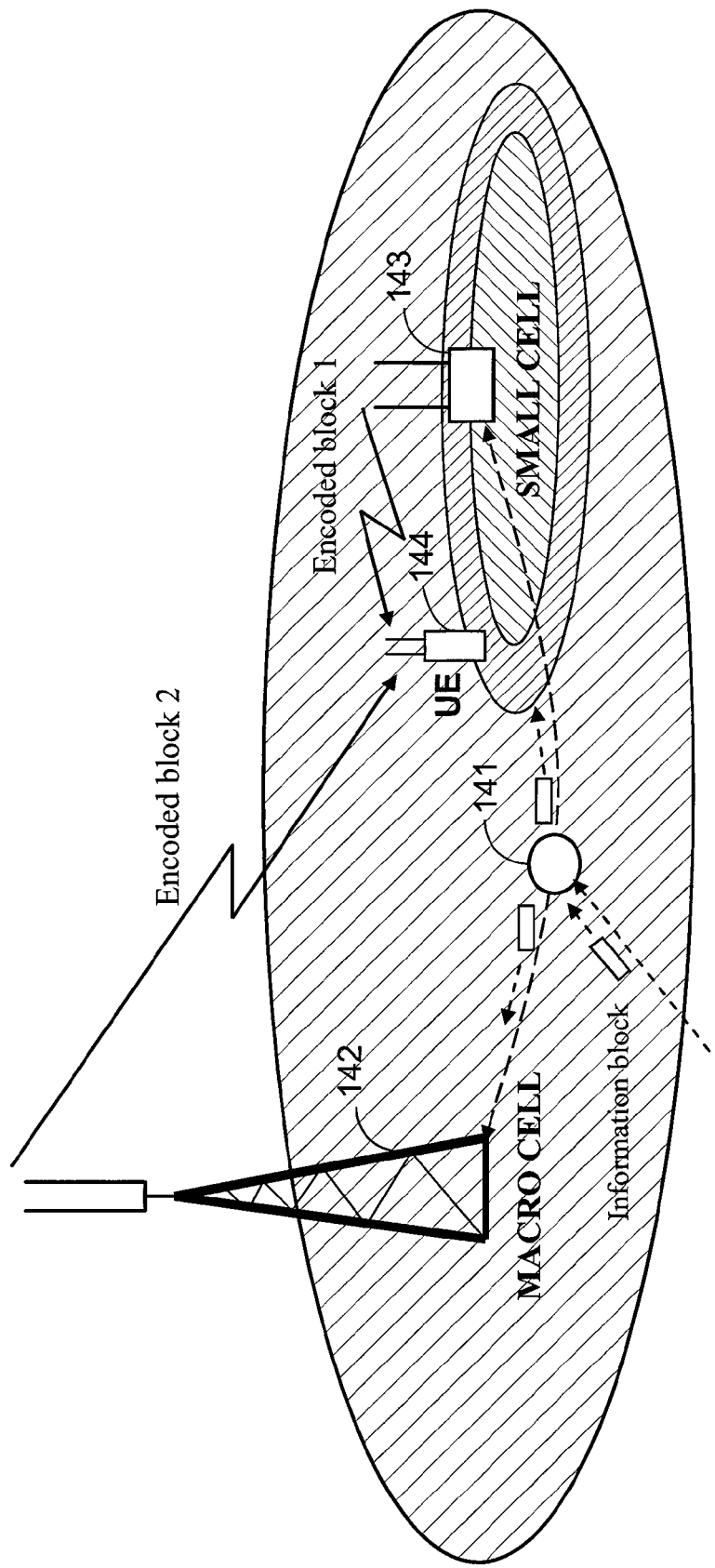
FIG. 14 depicts one possible embodiment for application of the described invention, where a proposed "generalized soft handover" mechanism is applied.

In yet another embodiment, a heterogeneous network comprising a mixture of macro cells and small cells is characterized by a significant cell area having SINR values well below 0 dB. This may happen e.g. when so-called Cell Range Expansion (CRE) is applied, by biasing handover thresholds in order to favour the small cell's coverage zone. FIG. 14 depicts one possible embodiment for application of the described invention, where a proposed "generalized soft handover" mechanism is applied. Assuming that the base stations are synchronized in time and frequency, and that the terminal can estimate the channel frequency responses from both macro cell and small cell, a variation of the proposed Alternative 1 invention (multi-antenna based turbo-transmit diversity) can be applied in order to enhance coverage.

Block (141) represents a node that connects the macro cell base station (block 142) with the small cell base station (block 143). This node may not appear when a direct link exists between cells (as in LTE, where X2 interface can directly connect the base stations). By application of the proposed invention for the multi-antenna case (alternative 1), the UE (block 144) receives two differently-encoded copies of the same information block from the two cells thus achieving a "generalized soft handover" for OFDM heterogeneous networks.

Figure 15:
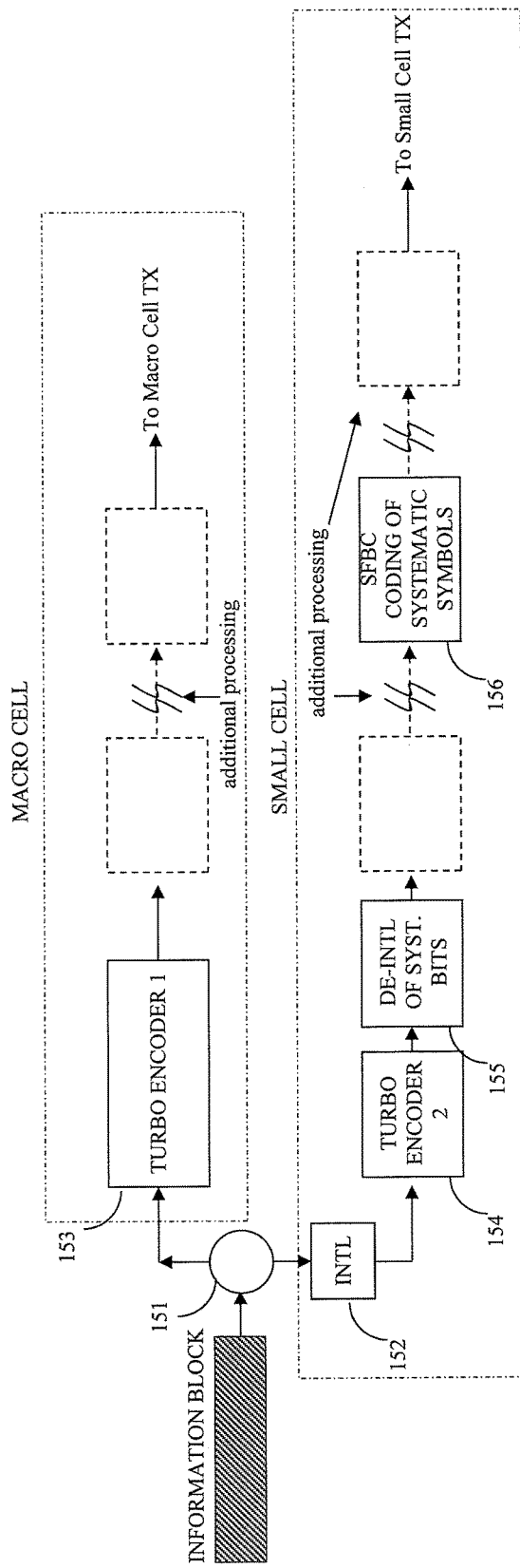
FIG. 15 depicts a detailed encoding process for the embodiment of FIG. 14.

FIG. 15 depicts a detailed encoding process for this case. The information block is split into two identical blocks in block (151), which is identical to block (141) in FIG. 14. Both information blocks are encoded in blocks (153) and (154), the second one preceded by the external interleaver (block 152). Output systematic bits from the second encoder are further de-interleaved (block 155). After additional processing (marked in dashed lines), systematic symbols are also SFBC-encoded in block (156) prior to transmission over the small cell antenna(s). The output from the first encoder, after additional processing, is transmitted by the macro cell antenna(s).

FIG. 11 is also a valid embodiment for a receiver structure in this situation. It would be located at the user terminal (UE).

All the blocks depicted in the proposed embodiments may be implemented as a collection of software elements, hardware elements, firmware elements, or any combination of them.

Advantages of the Invention

The proposed invention extends the ideas of diversity and channel coding in OFDM wireless systems, which are usually considered as separate entities, by introducing the notion of a combined turbo-diversity transmit scheme that makes use of an additional encoded block over a second transmit antenna or component carrier. With the aid of the proposed turbo-diversity decoding procedure, the invention enhances cell coverage by increasing the effective SINR at the cell edges.

Accurate reception at the cell edges is especially critical when dealing with control channels, where poor performance can result in a significant number of radio link failures.

Modern wireless communication systems are characterized by multi-antenna transmission and carrier aggregation, among other technologies. The proposed invention takes advantage of both technologies, along with classical Alamouti and turbo coding, yielding a combined turbo-diversity procedure where the advantage of having a second antenna or component carrier is exploited in an iterative way.

Cell-edge behaviour mainly determines global coverage and capacity, therefore enhanced coding schemes result in a direct reduction in CAPEX and OPEX through more efficient network deployments. This is especially useful in heterogeneous scenarios comprising a mix of macro cells and small cells, where a significant cell are suffer from heavy inter-layer interference hence demanding advanced detection techniques.

A person skilled in the art could introduce changes and modifications in the embodiments described without departing from the scope of the invention as it is defined in the attached claims.

ACRONYMS

3GPP Third Generation Partnership Project
BPSK Binary Phase Shift Keying
CAPEX Capital Expenditure
CA Carrier Aggregation
CC Component Carrier
CoMP Cooperative Multi-Point
CRE Cell Range Expansion
CRS Cell Reference Signal
CSI Channel State Information
GSM Global System for Mobile Communications
LLR Log-Likelihood Ratio
LTE Long Term Evolution
LTE-A Long Term Evolution Advanced
MIMO Multiple Input Multiple Output
ML Maximum Likelihood
MMSE Minimum Mean Squared Error
MRC Maximum Ratio Combining
NLOS Non-Line of Sight
OFDM Orthogonal Frequency Division Multiplex
OPEX Operational Expenditure
PDF Probability Density Function
QAM Quadrature Amplitude Modulation
QPSK Quadrature Phase Shift Keying
RF Radio Frequency
RX Receive
SFBC Space-Frequency Block Coding
SIC Successive Interference Cancellation
SINR Signal to Interference plus Noise Ratio
SISO Single Input Single Output
SNR Signal to Noise Ratio
SRS Sounding Reference Signal
STC Space-Time Code
STBC Space-Time Block Coding
TCM Trellis-Coded Modulation
TX Transmit
UE User Equipment
UMTS Universal Mobile Telecommunication System
WCDMA Wideband Code Division Multiple Access
WiMAX Wireless Microwave Access
ZF Zero-Forcing

REFERENCES

[1] M. Taskaldiran, R. C. S. Morling and I. Kale, "The Modified Max-Log-MAP Turbo Decoding Algorithm by Extrinsic Information Scaling for Wireless Applications", Lecture Notes in Electrical Engineering, 2009, Volume 44, 203-213
[2] S. Sesia, I. Toufik, M. Baker (editors), "LTE, the UMTS Long Term Evolution: From Theory to Practice", John Wiley & Sons, 2009
[3] 3GPP TS 36.212, Evolved Universal Terrestrial Radio Access (E-UTRA); "Multiplexing and Channel Coding (Release 10)"
[4] Y. Cho, J. Kim, W. Yang, C. Kang, "MIMO-OFDM Wireless Communications with Matlab", John Wiley & sons, 2010
[5] A. Damnjanovic et al, "A Survey on 3GPP Heterogeneous Networks", IEEE Wireless Communications, June 2011
[6] J. Ketonen and M. Juntti, "SIC and K-BEST LSD receiver implementation for a MIMO-OFDM System," Proc. European Signal Processing Conference, 2008
[7] M. Patzold, "Mobile Fading Channels", John Wiley and sons, 2002
[8] N. Mysore, "Combined Turbo Coding and Turbo Equalization for Wireless Systems with Antenna Diversity", Dept. of Electrical and Computer Engineering, McGill University, 2002
[9] D. Cui and A. Haimovich, "Design and Performance of Turbo Space-Time Coded Modulation", IEEE Global Telecommunications Conference, Globecom '00, pp 1627-1631, vol. 3, Nov. 27-Dec. 1, 2000
[10] D. van Wyk and P. van Rooyen, "On the Performance of Super-Orthogonal Turbo-Transmit Diversity for CDMA Cellular Communication", IEEE 6th Int. Symp. on Spread-Spectrum Tech. and Appli., Sep. 6-8, 2000
[11] Y. Liu and M. Fitz, "Space-Time Turbo Codes", Dept. of Electrical Engineering, Ohio State University
[12] S. Barbulescu, S. Pietrobon, "Turbo Codes: a Tutorial on a New Class of Powerful Error Correcting Coding Schemes", October 1998

The invention claimed is:
1. A method for implementing a turbo-diversity scheme in a wireless orthogonal frequency division multiplex (OFDM) system, the method comprising:
encoding, at a first turbo encoder and a second turbo encoder, information comprising data signals, and generating two different turbo code blocks each comprising a set of systematic and parity bits;
interleaving, by an external bit interleaver, the data signals to be encoded by said second turbo encoder;
de-interleaving said systematic bits after the second turbo encoder, and applying an Alamouti-based space-frequency block coding (SFBC) over said de- interleaved systematic bits after the second turbo encoder and said systematic bits after the first turbo encoder; and simultaneously transmitting each of said two different turbo code blocks over different transmit antennas through said wireless OFDM system.

2. The method according to claim 1, wherein said two different turbo code blocks generated are further processed using processing techniques according to any of a rate matching technique, scrambling, interleaving, or modulation mapping.

3. The method according to claim 1, further comprising separating from said two different turbo code blocks symbols carrying the systematic bits from symbols carrying the parity bits at a receiver side, and further performing Alamouti-based SFBC decoding to the symbols carrying the systematic bits and a Zero-forcing, minimum mean squared error (MMSE), maximum likelihood (ML), or other multiple input multiple output (MIMO) decoding technique to the symbols carrying the parity bits.

4. The method according to claim 3, further comprising obtaining Log-Likelihood Ratio values (LLR) corresponding to said symbols carrying systematic bits and said symbols carrying parity bits using the expression:

$$LLR(b_l) = \ln \frac{\sum_{t \in S_l^+} f(\hat{t}|t)}{\sum_{t \in S_l^-} f(\hat{t}|t)}$$

where $S_l^+, S_l^-$ denote a set of constellation symbols whose l-th bit is 1 and 0, respectively, and f is a conditional probability density function (PDF) of $\hat{t}$ given that symbol t was transmitted.

5. The method according to claim 4, further comprising decoding upon reception said symbols carrying systematic and parity bits by exploiting the outputs from each turbo decoding iteration of one transmit antenna as extrinsic information to the other transmit antenna, with appropriate interleaving or de-interleaving of the extrinsic information depending on the transmit antenna under consideration, using the expressions:

$$y^{(1)}[k] = y^s[k] + L_{12}^{(1)}[k] + c^{(1)} L_{21}^{(1)}[k] + c^{(2 \to 1)} L_e^{(2 \to 1)}$$

$$y^{(2)}[k] = \text{Intl}\{y^s[k]\} + L_{12}^{(2)}[k] + c^{(2)} L_{21}^{(2)}[k] + c^{(1 \to 2)} L_e^{(1 \to 2)}$$

where $y^{(1)}[k]$, $y^{(2)}[k]$ are the LLR values after a given iteration of the first turbo decoder and the second turbo decoder respectively; $L_{12}^{(1)}$, $L_{21}^{(1)}$ and $L_{12}^{(2)}$, $L_{21}^{(2)}$ represent mutual information terms exchanged by internal constituent decoders of the first turbo decoder and the second turbo decoder respectively; $c^{(1)}$, $c^{(2)}$ are extrinsic scaling factors for the first turbo decoder and the second Unix) decoder respectively; $c^{(2 \to 1)}$, $c^{(1 \to 2)}$ are mutual scaling factors for extrinsic information exchange between the second turbo decoder and the first turbo decoder, and between the first turbo decoder and the second turbo decoder, respectively; $L_e^{(2 \to 1)} = \text{Intl}^{-1}\{y^{(2)}[k]\}$ is de-interleaved output from a previous iteration of the second turbo decoder and $L_e^{(1 \to 2)} = \text{Intl}\{y^{(1)}[k]\}$ is interleaved output from a previous iteration of the first turbo decoder.

6. The method according to claim 5, further comprising decoding upon reception, using a successive interference cancellation technique, said symbols carrying parity bits through reconstruction and cancellation of interference at each received block caused by the other transmit antenna, using the expressions:

$$r_1^{(1)\prime} = r_1 - h_{12}\hat{t}_2 = h_{11}t_1 + n_1^{(1)\prime}$$

$$r_2^{(1)\prime} = r_2 - h_{22}\hat{t}_2 = h_{21}t_1 + n_2^{(1)\prime}$$

$$\vdots$$

$$r_M^{(1)\prime} = r_M - h_{M2}\hat{t}_2 = h_{M1}t_1 + n_M^{(1)\prime}$$

$$r_1^{(2)\prime} = r_1 - h_{11}\hat{t}_1 = h_{12}t_2 + n_1^{(2)\prime}$$

$$r_2^{(2)\prime} = r_2 - h_{21}\hat{t}_1 = h_{22}t_2 + n_2^{(2)\prime}$$

$$\vdots$$

$$r_M^{(2)\prime} = r_M - h_{M1}\hat{t}_1 = h_{M2}t_2 + n_M^{(2)\prime}$$

where $r_j$ denote signals received by antenna RX j; $r_j^{(1)}$, $r_j^{(2)}$ denote signals corresponding to both coded blocks that come from the antenna RX j after removal of interference; $n_j^{(1)\prime}, n_j^{(2)\prime}$ are complex baseband noise terms; $h_{ij}$ are complex channel transfer elements between TX antenna j and RX antenna i; and $\hat{t}_1$, $\hat{t}_2$ denote estimated symbols transmitted by TX antennas 1 and 2 respectively.

7. A system for turbo-diversity in a wireless orthogonal frequency division multiplex (OFDM) system, the system comprising:

a base station and at least a user terminal transmitting and receiving data signals through said wireless OFDM system;

a first turbo encoder and a second turbo encoder configured to encode said data signals received and to generate two different turbo code blocks each comprising a set of systematic and parity bits;

an external interleaver unit arranged to said second turbo encoder and configured to interleave the data signals prior to being encoded by the second turbo encoder;

a de-interleaver configured de-interleave the systematic bits after the second turbo encoder;

an Alamouti-based space-frequency block coding (SFBC) applied over said de-interleaved systematic bits after the second turbo encoder and said systematic bits after the first turbo encoder; and a transmitter configured to transmit each of said two different turbo code blocks over different transmit antennas.

* * * * *